US 8,877,611 B2

United States Patent
Mieczkowski et al.

(10) Patent No.: US 8,877,611 B2
(45) Date of Patent: Nov. 4, 2014

(54) DEVICES WITH CRACK STOPS

(71) Applicant: Cree, Inc., Durham, NC (US)

(72) Inventors: Van Allen Mieczkowski, Apex, NC (US); Daniel James Namishia, Louisburg, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/715,260

(22) Filed: Dec. 14, 2012

(65) Prior Publication Data

US 2013/0189829 A1   Jul. 25, 2013

Related U.S. Application Data

(63) Continuation of application No. 12/620,266, filed on Nov. 17, 2009, now Pat. No. 8,357,996.

(51) Int. Cl.
| | |
|---|---|
| *H01L 21/78* | (2006.01) |
| *H01L 23/00* | (2006.01) |
| *H01L 23/58* | (2006.01) |
| *H01L 21/683* | (2006.01) |

(52) U.S. Cl.
CPC ............ *H01L 21/78* (2013.01); *H01L 23/562* (2013.01); *H01L 2924/3011* (2013.01); *H01L 2221/68327* (2013.01); *H01L 23/585* (2013.01); *H01L 2924/0002* (2013.01); *H01L 21/6836* (2013.01)
USPC .................. 438/460; 257/620; 257/E23.194; 257/E21.211

(58) Field of Classification Search
USPC ............ 257/620, E23.194, E21.211; 438/460
See application file for complete search history.

(56) References Cited

U.S. PATENT DOCUMENTS

| | | | | |
|---|---|---|---|---|
| 4,161,814 | A * | 7/1979 | Ballantyne | ...................... 438/22 |
| 6,025,639 | A | 2/2000 | Mitwalsky et al. | |
| 2001/0028062 | A1 | 10/2001 | Uemura et al. | |
| 2004/0084403 | A1 | 5/2004 | Ohkuma | ........................ 216/27 |
| 2004/0147097 | A1 | 7/2004 | Pozder et al. | |
| 2006/0068567 | A1 | 3/2006 | Beyne et al. | |
| 2007/0176181 | A1 | 8/2007 | Kusunoki | |
| 2007/0221613 | A1* | 9/2007 | Gutsche et al. | .................. 216/57 |

(Continued)

FOREIGN PATENT DOCUMENTS

| | | |
|---|---|---|
| CN | 1484328 A | 3/2004 |
| EP | 1376687 A2 | 1/2004 |

(Continued)

OTHER PUBLICATIONS

Cree, Inc., Japanese Application No. 2012-539008, Office Action, Oct. 8, 2013.

(Continued)

*Primary Examiner* — Marc Armand
(74) *Attorney, Agent, or Firm* — Robert S. Pyles

(57) ABSTRACT

An apparatus that comprises a device on a substrate and a crack stop in the substrate. Methods of forming a device are also disclosed. The methods may include providing a device, such as a semiconductor device, on a substrate having a first thickness, reducing the thickness of the substrate to a second thickness, and providing a crack stop in the substrate. Reducing the thickness of the substrate may include mounting the substrate to a carrier substrate for support and then removing the carrier substrate. The crack stop may prevent a crack from reaching the device.

25 Claims, 10 Drawing Sheets

(56) References Cited

U.S. PATENT DOCUMENTS

| | | | |
|---|---|---|---|
| 2008/0135975 A1 | 6/2008 | Haraguchi et al. | |
| 2008/0277806 A1* | 11/2008 | Chen et al. | 257/797 |
| 2009/0032909 A1 | 2/2009 | Brofman et al. | |
| 2009/0203192 A1 | 8/2009 | Kaltalioglu et al. | 438/462 |
| 2009/0205177 A1 | 8/2009 | Tomiyama et al. | 29/25.35 |
| 2009/0218660 A1* | 9/2009 | Utsumi et al. | 257/620 |

FOREIGN PATENT DOCUMENTS

| | | |  |
|---|---|---|---|
| JP | H06-275713 A | 9/1994 | |
| JP | 2000022213 A | 1/2000 | |
| JP | 2003017790 A | 1/2003 | |
| JP | 2004-055852 A | 2/2004 | |
| JP | 2004-304081 A | 10/2004 | |
| JP | 2005-123263 A | 5/2005 | |
| JP | 2005-302985 A | 10/2005 | |
| JP | 2007-096115 A | 4/2007 | |
| JP | 2008-010639 A | 1/2008 | |
| JP | 2008-113382 A | 5/2008 | |
| JP | 2008-147412 A | 6/2008 | |
| JP | 2009-094451 A | 4/2009 | |
| JP | 2009-260323 A | 5/2009 | |
| KR | 2005109725 | 11/2005 | H01L 21/68 |
| WO | WO-2011/062845 | 5/2011 | |

OTHER PUBLICATIONS

Cree, Inc., Japanese Application No. 2012-539008, Office Action, Apr. 4, 2014.

Cree, Inc., Chinese Patent Application No. 201080051699.4, Office Action, Jun. 17, 2014.

Cree, Inc., Japanese Patent Application No. 2012-539008, Preliminary Examination Report, Aug. 1, 2014.

* cited by examiner

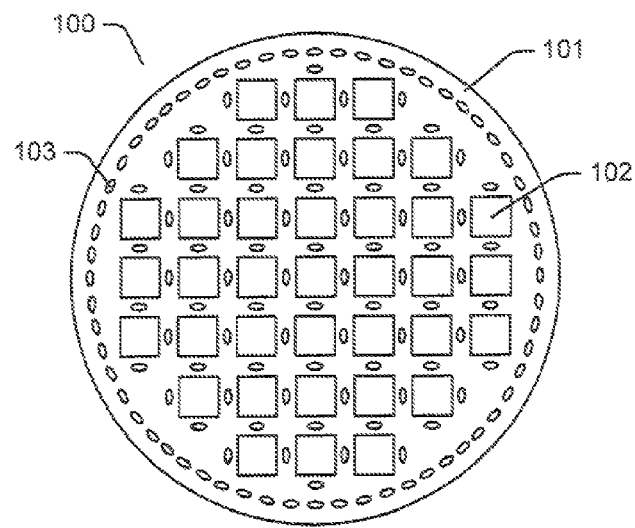
FIG. 1C
   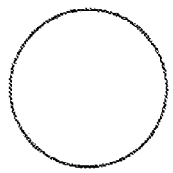   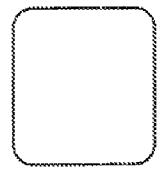   
FIG. 2A       FIG. 2B       FIG. 2C       FIG. 2D

DEVICES WITH CRACK STOPS

CROSS-REFERENCE TO RELATED APPLICATION

The present application is a continuing application of U.S. application Ser. No. 12/620,266 (now U.S. Pat. No. 8,357, 996), filed Nov. 17, 2009, assigned to The assignee of the present application, the disclosure of which is hereby incorporated by reference in its entirety as if set forth fully herein.

FIELD OF THE INVENTION

This invention relates to devices, such as semiconductor devices and the fabrication of such devices.

BACKGROUND

The thickness of substrates in semiconductor devices can affect the forward voltage needed to operate the devices at a given current level. In some applications, the performance and/or operation of devices such as SiC Schottky diodes, MOSFETs, MESFETs, BJTs, PiN diodes, n-channel IGBTs, thyristors, vertical JFETs, GaN HEMTS, and/or light emitting diodes (LEDs), etc. may be affected by the relatively high resistance of thick substrates. For example, n-type, 4H-SiC substrates may account for about 1 mohm-cm$^2$ of the specific on-resistance of various devices. This may constitute about 50% of the on-resistance of a 600 V SiC Schottky diode, and/or about 90% of the on-resistance of a 300V SiC Schottky diode. A p-type 4H-SiC substrate may add about 50-100 mohm-cm$^2$ to the device on-resistance. For this reason, it has not been practical to develop vertical devices, such as GTOs and n-channel IGBTs, on p-type SiC substrates. As such, it is sometimes desirable to reduce the thickness of a substrate on which a device is provided. In the case of monolithic microwave integrated circuits (MMICs), such as GaN HEMT and/or SiC MMICs, the substrate thickness may be thinned to control transmission line impedance by allowing the use of viaholes that may provide a low impedance ground connection to the frontside of the device. Reducing the thickness of a substrate is discussed, for example, in U.S. Pat. No. 7,547, 578, the disclosure of which is incorporated herein by reference in its entirety.

Present device fabrication technology for reducing the thickness of a substrate typically employs mounting a substrate with devices thereon to a carrier substrate for support and then etching, polishing, or grinding the substrate. In some processing steps, the removal of the carrier substrate may introduce unwanted strain to the reduced thickness substrate and cracks may be introduced within the substrate that propagate and damage the devices located thereon. Cracks may also be introduced in other processing steps, such as device singulation.

SUMMARY

Embodiments of the present invention provide an apparatus comprising a device on a substrate and a crack stop in and/or integral to the substrate that reduces or impedes crack formation and thereby may act to protect the device on the substrate. Multiple crack stops may be located at various positions in the substrate, such as along the perimeter of the substrate and/or in between multiple devices on the substrate. Depending on the embodiment, a crack stop may extend from one surface of the substrate and either partially or completely through another surface of the substrate. The crack stop may be a void or a trench in the substrate. Different types of crack stops may be used together in a substrate that may reduce cracking or the formation of different types of cracks or defects.

Some embodiments of the present invention provide a crack stop in at least a substrate or a device on a substrate where the crack stop may be oriented at an angle less than or greater than 90 degrees with respect to a surface of the substrate depending on the embodiment.

Some embodiments of the present invention describe methods of making an apparatus that comprises a device on a substrate and a crack stop in the substrate that is separate from the device. Methods may comprise providing at least two devices on a substrate wherein the substrate has a first thickness, reducing the thickness of the substrate to a second thickness, and providing at least one crack stop in the substrate wherein the crack stop is located separate from the at least two devices along the perimeter of the substrate and/or in between devices. Methods may further comprise mounting a carrier substrate to the at least two devices on a side opposite the substrate and etching, polishing, or grinding the substrate. Methods may also include singulating the devices. In some embodiments, methods may include providing a crack stop in the substrate at the same time as providing one or more via holes through the substrate and devices.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIGS. 1A-1C illustrate various examples of an apparatus according to some embodiments of the invention;

FIGS. 2A-2D illustrate various embodiments of the invention;

DETAILED DESCRIPTION OF EMBODIMENTS OF THE INVENTION

Figure 1A:
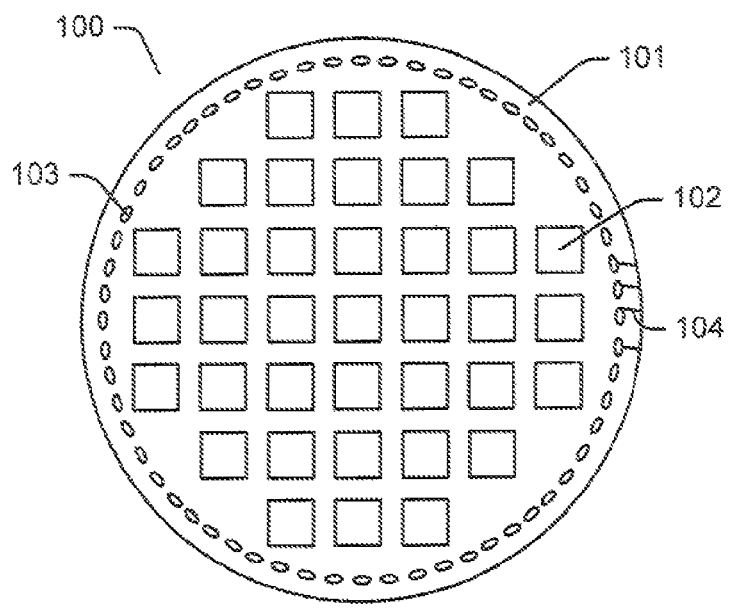

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As described herein in greater detail, some embodiments according to the invention can provide an apparatus that includes a device on a substrate and a crack stop in a substrate (i.e., a wafer). As used herein, a crack stop can include any structure that serves to impede or reduce crack formation, such as terminating a crack propagating through substrate and/or the device. A crack stop may be a void in the substrate and/or device such as a hole, notch, trench, etc. that extends either partially or completely through the substrate and/or device. A crack stop may also include other materials on or in the substrate that also serve to stop propagating cracks, for example, voids could be filled with different materials, such as metals, insulators, dielectrics, etc. . . . A crack stop may also include polycrystalline materials on or in the substrate. In some embodiments, it may be desirable to provide crack stops in the substrate only in locations separate from a device, such as the perimeter of a substrate and/or in-between devices in order to increase the amount of devices a particular substrate may yield. Cracks may follow the crystallographic plane of a substrate material and in some embodiments, crack stops may be provided in areas where the likelihood of crack formation is the highest.

As shown in FIGS. 1A-1E, an apparatus 100 may include a substrate 101 with one or more devices 102 on the substrate 101 and one or more crack stops 103 on and/or in the substrate 101. It will be understood that the one or more devices 102 may be semiconductor devices such as compound semiconductor devices, HEMTs, GaN HEMTS, LEDs, PIN diodes, MOSFETs, MESFETs, IGBTs, BJTs, thyristors, JFETS, GTOs, Schottky diodes, MMICs including GaN HEMTs and/or SiC devices, etc. made of any known semiconductor material, including gallium nitride and/or alloys thereof, silicon carbide, gallium arsenide and/or alloys thereof, and gallium phosphide and/or alloys thereof. The devices 102 may include other types of devices; thus, the foregoing list is not intended to be limiting. The devices 102 may include one or more epitaxial layers/regions formed on the wafer 101. The layers/regions may be provided, for example, by epitaxial growth and/or by ion implantation followed by device isolation that may include mesa formation or other methods, such as, for example, junction isolation, trench isolation, and/or implant isolation.

In some embodiments according to the invention, the substrate and/or associated epitaxial layers may include silicon carbide of the 4H, 6H, 15R or 3C polytypes, or another type of compound semiconductor material known to those skilled in the art, such as, for example, silicon nitride, gallium arsenide and/or alloys thereof, gallium phosphide and/or alloys thereof, gallium nitride and/or alloys thereof, aluminum nitride, aluminum gallium nitride, indium nitride and/or alloys thereof, indium gallium nitride, aluminum indium gallium nitride, magnesium oxide (MgO), magnesium aluminate ($MgAl_2O_4$), lithium gallate ($LiGaO_2$), lithium aluminate ($LiAlO_2$), zinc oxide (ZnO), nickel aluminate ($NiAl_2O_4$), and/or sapphire. In some embodiments, the substrate may comprise silicon. It will be understood that the term "substrate" and "wafer" may be used interchangeably. In some embodiments, a substrate may include additional layers, such as one or more epitaxial layers. For example, a substrate may include a silicon wafer or a sapphire wafer with one or more GaN base layers provided thereon. In some embodiments, the substrate itself may be one or more epitaxial layers that are sufficient to support a device.

Figure 1B:
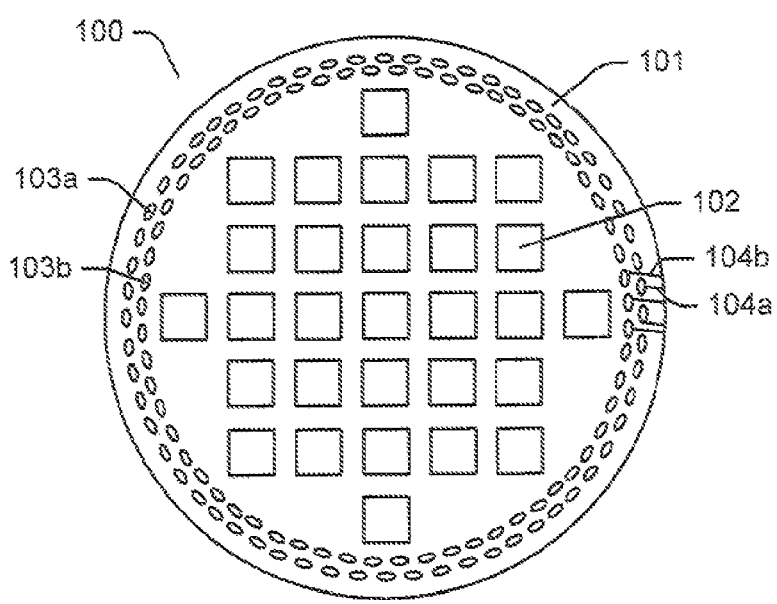

FIG. 1A illustrates an apparatus 100 with crack stops 103 formed in a circle pattern along the perimeter of a substrate 101. One or more devices are provided on the substrate in a location separate from the crack stops 103. In some instances, a crack 104 may begin along an edge of the substrate 101 and propagate inward. The one or more crack stops 103 may be located to reduce the likelihood that cracks 104 reach the one or more devices 102. As shown in FIG. 1B, the crack stops 103 may be provided in multiple rows or multiple circle patterns along the perimeter of the substrate. The arrangement of multiple rows or circles may be such that a crack 104b that happens to propagate between crack stops 103 of the first circle pattern 103a may terminate at next circle pattern 103b. Other cracks 104a may also terminate at the first circle pattern 103a. It will be appreciated that there may be multiple other arrangements for the crack stops 103, such as three or more rows, random arrays, and/or ordered or staggered patterns at the perimeter and/or between devices 102 (as shown in FIG. 1C and/or 3C).

As previously discussed, a crack stop may be a void or a hole in a substrate. FIGS. 2A through 2D show possible shapes for crack stops including ovals (FIG. 2A) or elongated ovals, circles (FIG. 2B), squares (FIG. 2C), or crescent shapes (FIG. 2D). Crack stops may include other shapes that are sufficient in reducing the propagation of cracks; thus, the foregoing list is not intended to be limiting. The shape of crack stops may be determined by processing the substrate through patterned openings in a mask. The shape of crack stops may also be dictated by the crystallographic structure of the substrate, such as hexagonal, etc. In some embodiments, it may be desirable to provide crack stops with rounded edges as cracks may sometime originate at or near sharp edges. In some embodiments, a cross-sectional diameter or other cross-sectional distance parameter of the crack stop may be between 1 and 100 μm. In some embodiments, the cross-sectional diameter or other cross-sectional distance parameter of the crack stop may be between 10 and 20 μm.

Figure 3A:
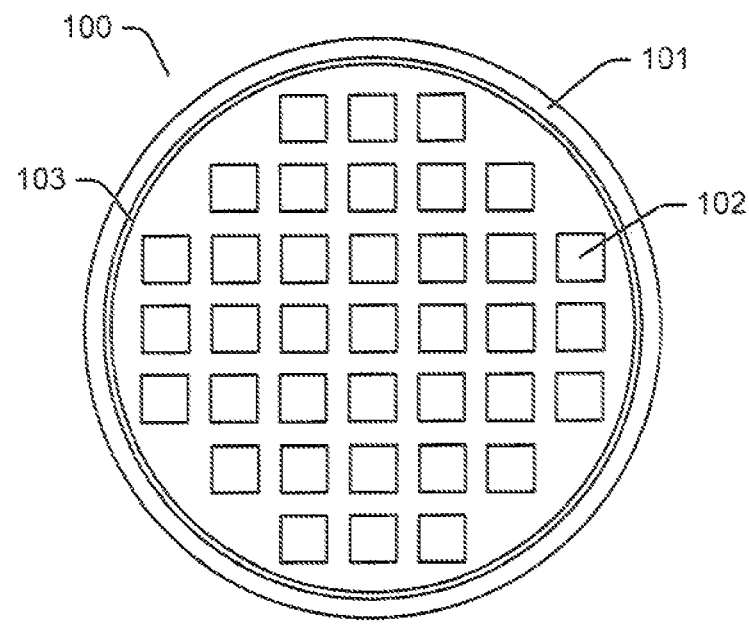
FIGS. 3A-3D illustrate various examples of an apparatus according to some embodiments of the invention.
Figure 3B:
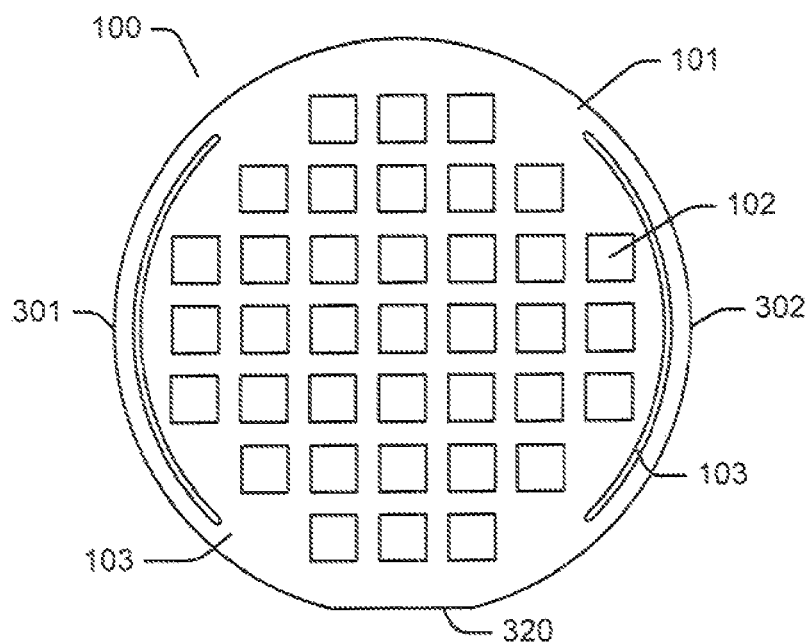
Figure 3C:
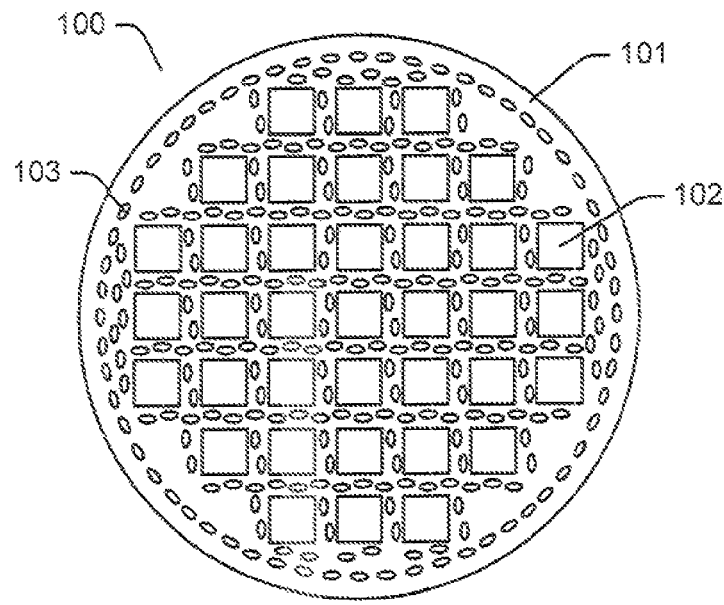
Figure 3D:
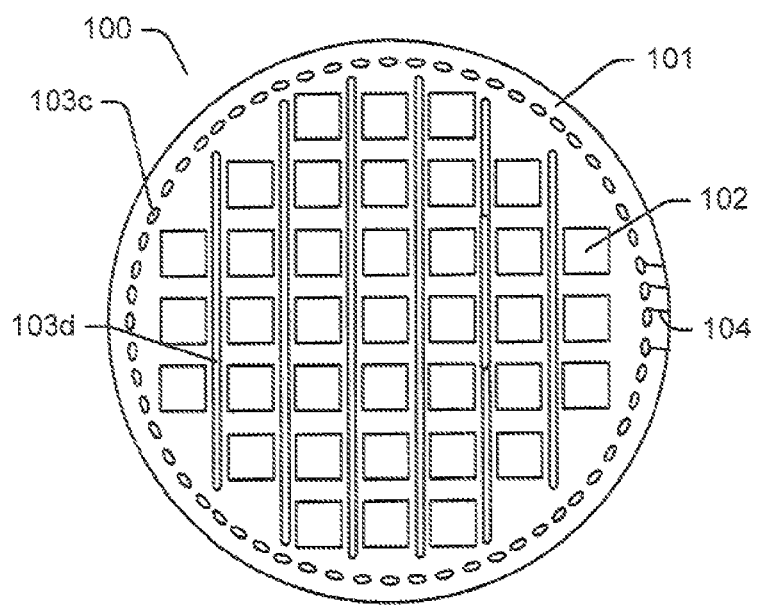

As shown in FIGS. 3A and 3B, crack stops 103 may also be provided in the shape of an elongated trench. The crack stop 103 may extend completely around the substrate 101, as shown in FIG. 3A or the crack stop 103 may be located in certain areas of the substrate 101, such as near the left side 301 and/or right side 302 relative to the major flat 320 as shown in FIG. 3B, where the likelihood of crack formation may be higher. It will be appreciated that the likelihood of crack formation at a given location may be different for different substrates, processes and/or devices and crack stops of any size may therefore be located anywhere on and/or within the substrate, including the top, bottom, left side, right side and/or middle of the substrate. For example, in some embodiments where silicon carbide may be used as a substrate material, cracks may have a higher likelihood of forming on the left and right sides of the substrate relative to a major flat side. As shown in FIG. 3D, different types of crack stops may be used together in a substrate 101. For example crack stops in the shape of voids or holes 103c and trenches 103d may also be provided on the same substrate. It will be understood that various configurations of different types of crack stops may be used, such as holes 103c along the perimeter of the substrate and trenches 103d between devices 102, or holes 103c between devices 102 and trenches 103d along the perimeter, and/or combinations thereof.

Figure 4A:
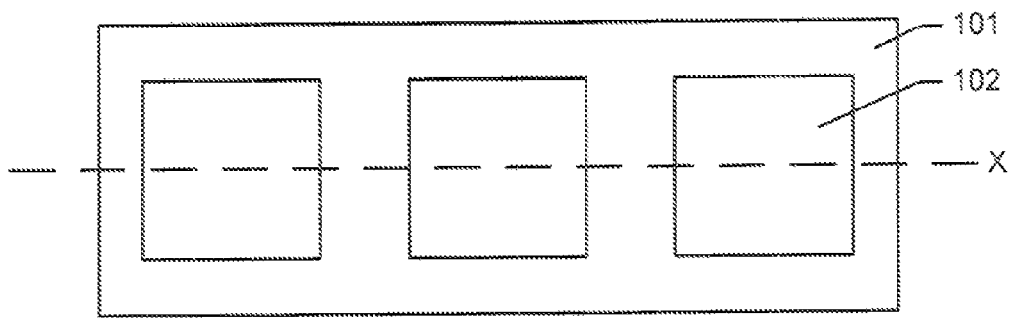
FIGS. 4A-4B illustrate various examples of an apparatus according to some embodiments of the invention.
Figure 4B:
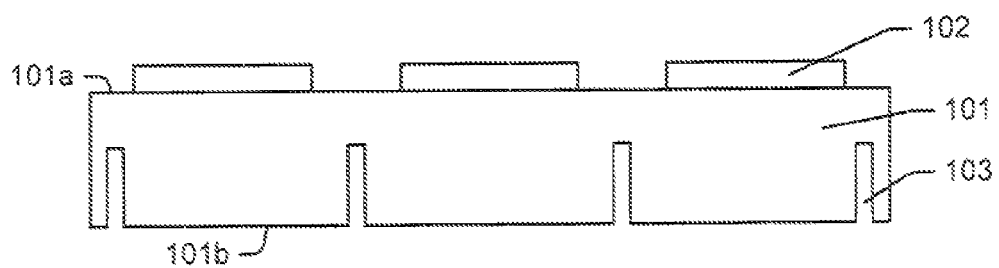

FIGS. 4A-4B, 5A-5B, and 6A-6B respectively show planar and cross-sectional views of possible configurations of an apparatus that includes a device 102 on a substrate 101 wherein the substrate 101 may include a crack stop 103. Other configurations are also possible. Referring now to FIGS. 4A-4B where FIG. 4B is a cross-section view along dotted line X of FIG. 4A, one or more devices 102 are provided on a first surface 101a of a substrate 101 and the substrate 101 includes one or more crack stops 103. The one or more crack stops 103 may extend from a second surface 101b of the substrate towards but not through the first surface of the substrate 101a and as such, the one or more crack stops 103 may not be visible from the planar view of FIG. 4A. The one or more crack stops 103 may also extend from a first surface 101a of the substrate towards but not through the second surface of the substrate 101b and as such, the one or more crack stops 103 may not be visible from the planar view of FIG. 4A (not shown). As shown, the one or more crack stops 103 may be located along the perimeter of the substrate and/or between the devices. It will be appreciated that the crack stops may also be provided in different configurations than what is shown, such as only along the perimeter of the substrate or only between the devices. It will also be appreciated that the crack stops may extend from second surface 101b towards the first surface 101a at any distance, such as between 0-25% of the thickness of substrate 101, or 25-50%, or 50-75% of the substrate thickness, and/or 75-100% of the substrate thickness.

Figure 5A:
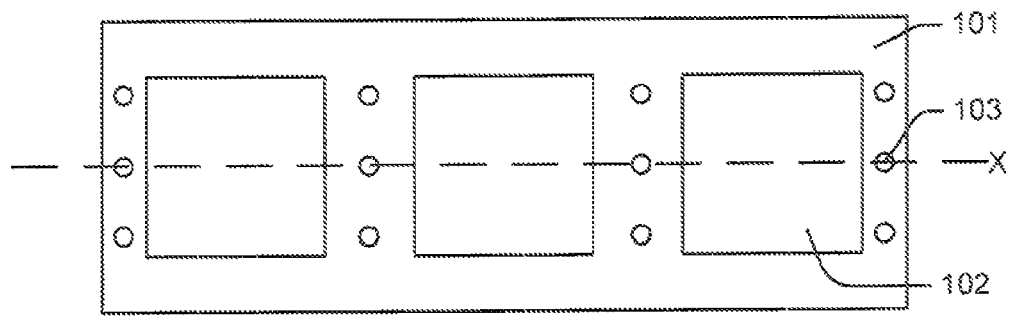
FIGS. 5A-5B illustrate various examples of an apparatus according to some embodiments of the invention.
Figure 5B:
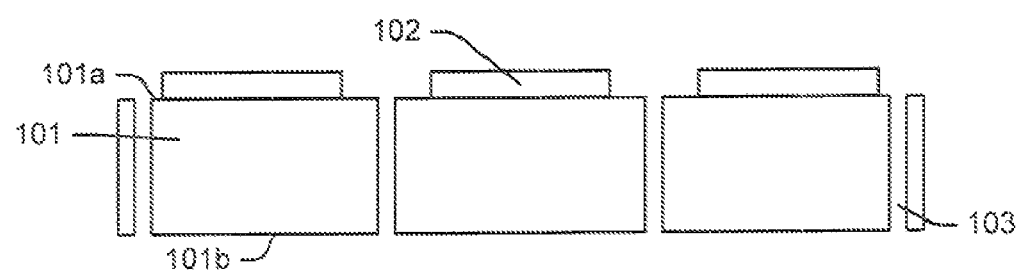

Referring now to FIGS. 5A-5B where FIG. 5B is a cross-section view along dotted line X of FIG. 5A, one or more devices 102 are provided on a first surface 101a of a substrate 101 and one or more crack stops 103 are provided in the substrate 101. The one or more crack stops 103 may extend from a second surface 101b of the substrate 101 towards and completely through the first surface 101a of the substrate and as such, the one or more crack stops 103 may be visible from the planar view of FIG. 5A. The one or more crack stops 103 may also extend from a first surface 101a of the substrate 101 towards and completely through the second surface 101b of the substrate 101. As in previous embodiments, the one or more crack stops 103 may be located along the perimeter of the substrate and/or between the devices. It will be appreciated that the crack stops may also be provided in different configurations than what is shown, such as only along the perimeter of the substrate or only between the devices.

Figure 6A:
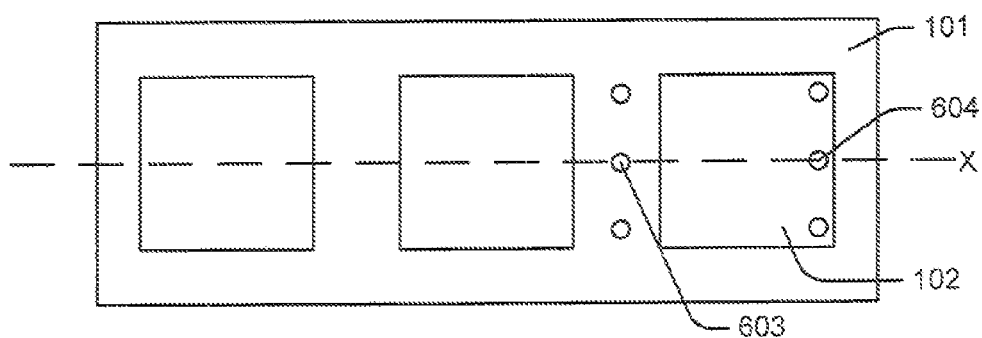
FIGS. 6A-6B illustrate various examples of an apparatus according to some embodiments of the invention.
Figure 6B:
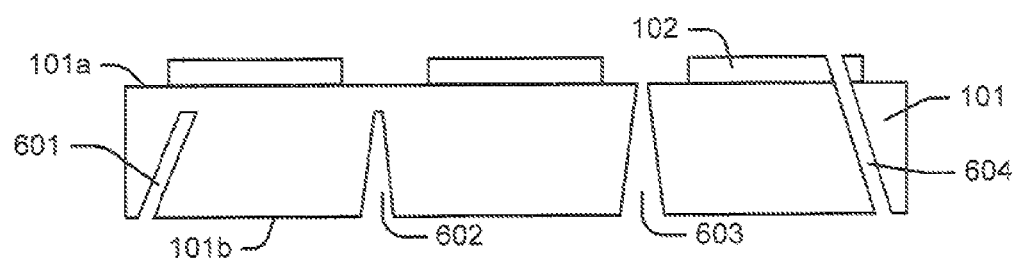

Referring now to FIGS. 6A-6B where FIG. 6B is a cross-section view along dotted line X of FIG. 6A, one or more devices 102 are provided on a first surface 101a of a substrate 101 and one or more crack stops 601-604 are provided in the substrate 101 in similar arrangements as previously described. In some embodiments, sidewalls of one or more of the crack stops 601-604, may be oriented at angles that are less than or greater than 90 degrees with respect to the second surface 101b of the substrate 101. The crack stop sidewalls may be parallel to each other, as shown in crack stops 601 and 604. The crack stop sidewalls may also be non parallel to each other, as shown in crack stops 602 and 603. Different etching techniques, as described previously, may yield crack stops with different shapes and orientations. In some embodiments, a crack stop 604 may be provided in at least one of the substrate 101 and the device 102. The crack stop 604 may be oriented at any angle with respect to the second surface 101b of the substrate 101.

As described herein in greater detail, some embodiments according to the invention can provide methods of processing substrates with crack stops and devices by, for example, reducing or thinning a thickness of a substrate having devices formed thereon by processing the substrate from a backside thereof. A substrate generally has two major parallel surfaces. As used herein, the term "backside" of a substrate refers to a surface of the substrate opposite the "front side" surface of the substrate at which one or more devices are formed. Crack stops may be provided during processing to reduce various cracks, such as those propagating through the substrate and/or the device, which may form during various process steps, such as the substrate thinning and/or demounting a thinned substrate from a carrier substrate.

Figure 7A:
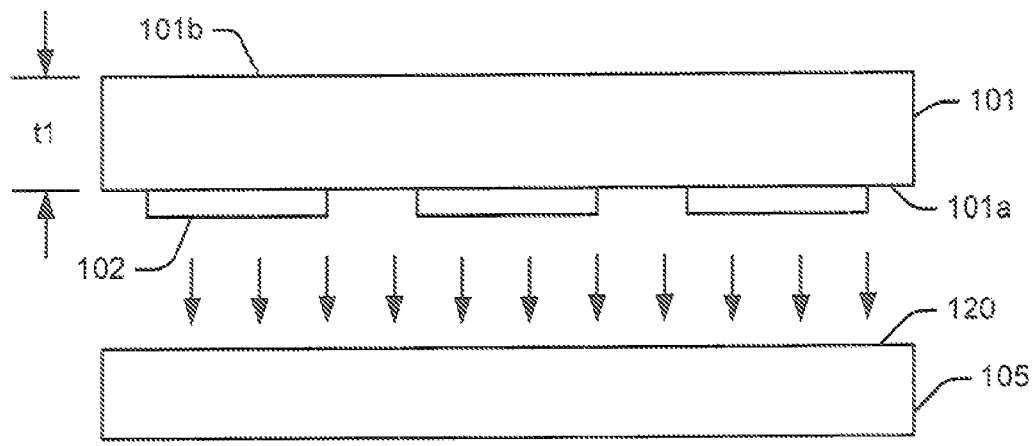
FIGS. 7A-7G are cross-sectional illustrations that illustrate various examples of an apparatus and methods of making according to some embodiments of the invention.

As shown in FIG. 7A, a substrate 101 may typically have a thickness (t1) of about 300 microns to about 500 microns or more, although other thicknesses are possible. One or more devices 102 are formed on a front side 101a of the substrate 101 that is opposite a backside 101b of the substrate 101. As previously discussed, the devices 102 may be epitaxially grown on the front side 101a of the substrate and subsequent front side processing may include device isolation steps such as mesa formation. A carrier substrate 105 on which an adhesive surface 120 is provided. The adhesive surface 120 may include, for example, thermoplastics, electrostatic bonding, epoxies such as cross-linked epoxies, glues such as UV-cured glues, wax and/or adhesive tape or any other suitable material. The arrows in FIG. 7A indicate that the front side 101a of substrate 101 (including devices 102) is brought into contact with the adhesive surface 120 on the carrier substrate 105. The carrier substrate 105 may include any suitable material capable of providing mechanical support for the substrate 101, including devices 102 thereon, during subsequent processing steps. The carrier substrate 105 may include, for example, sapphire, silicon, silicon carbide, aluminum, alumina, and/or any other suitable support material.

Figure 7B:
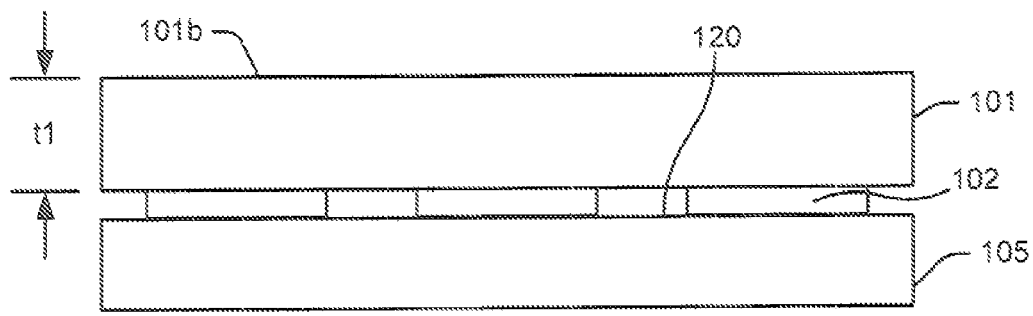

As shown in FIG. 7B, in some embodiments according to the invention, a substrate 101 (including the one or more of devices 102) and a carrier substrate 105 are coupled together via an adhesive layer 120 in contact with the one or more of devices 102 so that the assembly can be processed by, for example, mounting the carrier substrate 105 in a grinder (not shown) so that the backside 101b of the substrate 101 can be accessed. It will be understood that the substrate 101 including the plurality of devices 102 thereon can be coupled to the carrier substrate 105 using any technique known to those skilled in the art, such as a wax, and that an adhesive layer 120 may be applied to the plurality of devices 102 or to the carrier substrate 105. It will be further understood that the term "contact" includes direct contact as well as indirect contact where, for example, one or more intervening elements (such as the adhesive layer described above) are present between the substrate 101 and the carrier substrate 105 so that these two elements can be coupled together and the backside 101b of the substrate 101 can be processed while the substrate 101 is being supported by the carrier substrate 105.

Figure 7C:
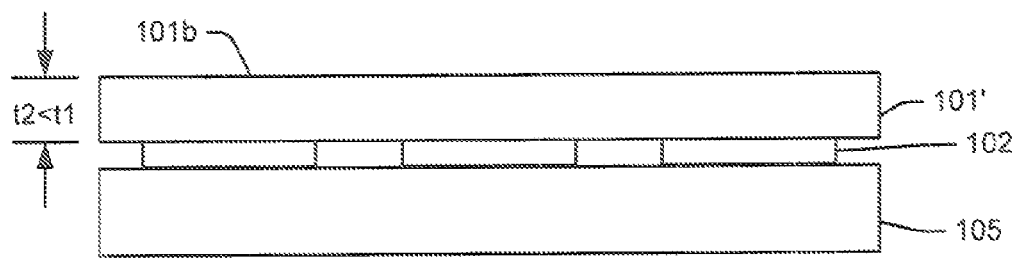

Referring to FIG. 7C, in some embodiments according to the invention, the backside 101b of the substrate 101 is processed to reduce the substrate 101 to a thickness t2, which is less than t1, to form a thinned substrate 101'.

In some embodiments according to the invention, the thickness of the substrate 101 is reduced using a grinder, such as an in-feed or creep feed grinder. In other embodiments according to the invention, the thickness of the substrate 101 is reduced using lapping, chemical or reactive ion etching or combinations of these approaches with or without grinding or by any other suitable method. In still other embodiments according to the invention, etching may be used to treat the backside of the thinned substrate to reduce damage to the substrate that may result from the thinning operation. Methods of thinning a wafer are described, for example, in commonly assigned U.S. patent application Ser. No. 10/987,135, filed Nov. 12, 2004 by Slater et al. entitled "Methods of Processing Semiconductor Wafer Backsides Having Light Emitting Devices (LEDs) There on and LEDs so Formed"; U.S. patent application Ser. No. 11/064,798, filed Feb. 23, 2005 by Edmond et al, entitled "Substrate Removal Process for High Light Extraction LEDs"; U.S. patent application Ser. No. 10/951,042, filed Sep. 22, 2004 by Edmond et al. entitled "High Efficiency Group III Nitride-Silicon Carbide Light Emitting Diode"; U.S. patent application Ser. No. 11/037,965, filed Jan. 18, 2005 by Edmond et al. entitled " High Output Small Area Group III Nitride LEDs", the disclosures of which are incorporated herein by reference in their entirety.

In some embodiments according to the invention, the substrate 101 is thinned to a thickness of less than about 150 microns. In other embodiments according to the invention, the substrate 101 is thinned to a thickness of less than about 120 microns. In further embodiments according to the invention, the substrate 101 is thinned to a thickness of from about 100 microns to about 80 microns or less.

Figure 7D:
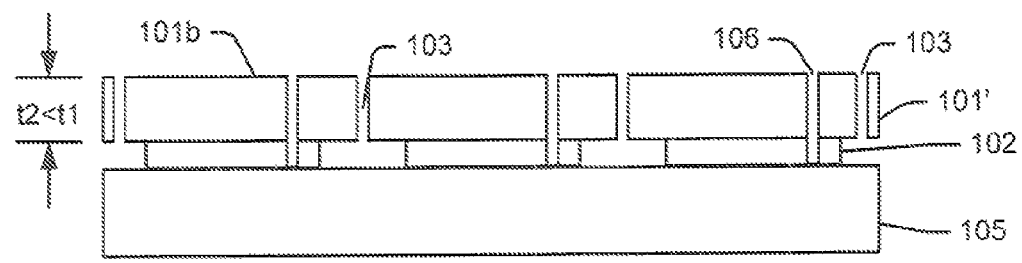

Referring to the embodiments of FIG. 7D, the processing of some devices, such as gallium nitride HEMTs, may provide via holes 106 through the thinned substrate 101' and one or more devices 102 for backside to front side communication. In order to reduce manufacturing steps, one or more crack stops 103, as previously described, may be provided in the substrate 101' during the same processing step as via hole 106 formation. The step of creating a crack stop 103 may include any suitable technique. For example, the processing step to provide a via hole 106 and a crack stop 103 may include patterning the backside 101b of the substrate 101' with a standard patterned mask, such as a photoresist mask (not shown), etching the via hole 106 and the crack stop 103 simultaneously through separate mask openings, and then removing the patterned mask. The shape and size of the openings in the patterned mask may determine the shape and depth of the resulting via 106 and crack stop 103. For a given etching step, a larger mask opening may result in a faster etch and therefore yield a via 106 or a crack stop 103 that extends completely through the substrate 101' and/or device 102. For the same etching step, a smaller mask opening may result in a via 106 or a crack stop 103 that only extends partially through substrate 101'. Various known etching techniques may be used, for example dry plasma etching, reactive ion etching (RIE) and the like with CF4, CCl2F2, BCl3, SF6, N2O, O2, etc. In some embodiments, a dry etch may provide a crack stop that is not aligned with a crystallographic plane of the substrate. The etching step may also include wet etching with HCL, sulfuric acid, hydrogen peroxide, etc. In other embodiments, the crack stops 103 may be provided during a processing step separate from via 106 formation. In some embodiments, a wet etch may provide a crack stop along a crystallographic plane of the substrate. It will be understood that a planar view (not shown) of crack stops in any of FIGS. 7D-7F may be similar to the planar view of crack stops shown in previous figures, such as FIG. 5A. In some embodiments, crack stop voids may be optionally filled with materials, such as metals, insulators, dielectrics, etc. that may provide structural integrity while still preventing cracks.

Figure 7E:
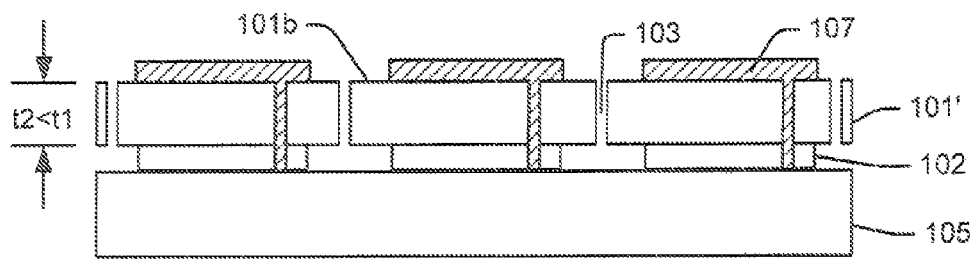

Referring to the embodiments of FIG. 7E, contacts 107, that may comprise ohmic contacts, may be formed on the backside 101b of the substrate 101' using, for example, localized annealing as discussed in U.S. patent application Ser. No. 10/916,113, entitled "Localized Annealing of Metal-Silicon Carbide Ohmic Contacts and Devices So Formed" to Slater et al., filed Aug. 11, 2004, which is commonly assigned to the present assignee, the disclosure of which is incorporated herein by reference. It will be understood that the contacts can be formed on the thinned substrate 101' while the substrate 101' is coupled to the carrier substrate 105. In some embodiments according to the invention, the contacts 107 can be formed on the thinned substrate 100' after the substrate is removed from the carrier substrate 105.

To form the contacts 107, a metal layer may be formed on a backside 101b of the substrate 101' opposite the devices 102. In particular, a layer of platinum, titanium, or nickel can be formed to a thickness of about 400 angstroms to about 1100 angstroms. In some embodiments, other suitable contact materials may be used.

The metal layer may then be annealed using a localized annealing technique, such as laser annealing or any other suitable technique. For examples where the substrate may be silicon carbide, the laser light used to anneal the metal-SiC ohmic contacts can be a laser light having a wavelength and intensity sufficient to form the metal-silicide material at the interface of the metal layer and the thinned substrate 101'. For example, in embodiments using 6H SiC as the substrate, laser annealing may be accomplished by impinging laser light having a wavelength of about 248 nanometers to about 308 nanometers at an energy of about 2.8 joules per square centimeter in a single pulse having a duration of about 30 nanoseconds. In other embodiments according to the invention where, for example, the SiC substrate is 4H SiC, the laser light may have a wavelength of about 248 nanometers to about 308 nanometers and an energy of about 4.2 joules per square centimeter applied in about 5 pulses, each having a duration of about 30 nanoseconds. In still other embodiments according to the invention, other suitable wavelengths and energies may be used to provide annealing at the interface location of the metal layer and the SiC substrate via absorption of light including photon energies that are above the bandgap of the SiC substrate. It will be understood that pulsed and/or continuous loop lasers may be utilized.

Electron beam annealing may be used as an alternative to laser light. Accordingly, an electron beam may be used to anneal the interface locations of the metal layer and the SiC substrate to form the metal-SiC material thereat.

Figure 7F:
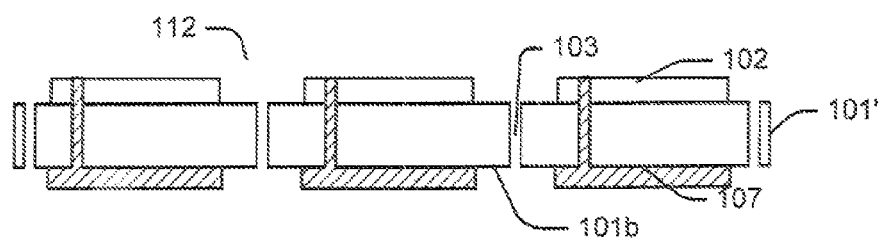

Once the backside 101b has been processed to sufficiently thin the substrate 101 (resulting in the formation of a thinned substrate 101'), the carrier substrate 105 can be removed from the assembly by, for example, heating the adhesive layer 120 so that the thinned wafer 101' and the plurality of devices 102 thereon may be removed as shown in FIG. 7F. In other embodiments according to the invention, the carrier substrate 105 can be removed from the assembly using an appropriate solvent and/or by exposing the structure to ultraviolet light. For example, the adhesive layer 120 may be dissolved and/or melted to separate the carrier substrate 105 from the substrate 101'.

Figure 7G:
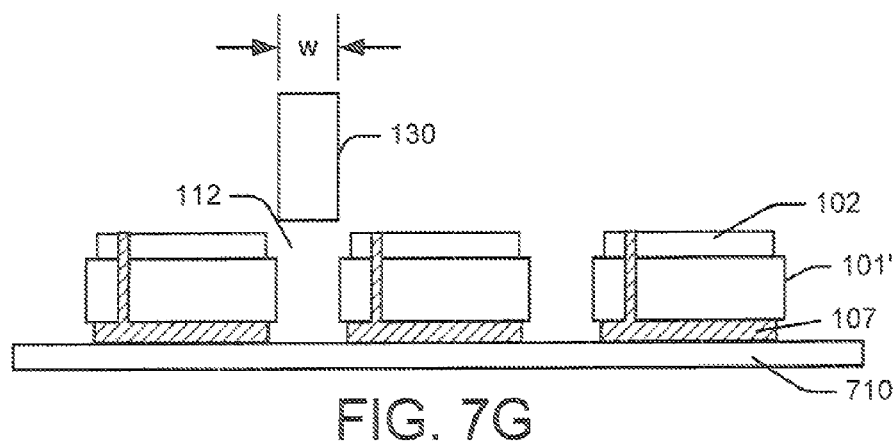

Referring to the embodiments of FIG. 7F and 7G, the plurality of devices 102 may be separated from one another by, for example, scribing and/or breaking the thinned substrate 101' and/or partially or completely cutting through the entire substrate 101' with a dicing saw or by any other suitable technique. For example, a saw blade 130 can be used to cut the substrate 100' along dicing streets 112 to separate the plurality of devices 102 for packaging. In some embodiments, a dicing street 112 may comprise dicing lines and/or one or more previously formed trenches. It will be understood that the saw blade 130 can cut through the entire substrate 101' to form straight edges on the thinned substrate 101' between the separated plurality of devices 102 or substantially through the thinned substrate 101' so that the devices 102 may be separated from one another by applying pressure along score lines formed by the saw blade 30. In some embodiments, a saw blade 130 may have a width w in the range of 15 μm to 175 μm. In other embodiments, a saw blade may have a width w in the range of 30 μm to 50 μm. In some embodiments, a crack stop 103 may be aligned with a dicing street 112 between devices 102. A saw blade 130 may have a width w that is greater than, equal to, or less than a diameter d of a crack stop 103. A flexible material 710, such as dicing tape 710 may optionally be used during the singulation process. In some embodiments, the singulation process may leave both singulated devices and singulated portions of the perimeter of the substrate on the flexible material 710. The singulated portions of the perimeter of the substrate may comprise a crack stop.

In some embodiments according to the invention, one or more layers may be formed on a substrate to a thickness such that the substrate and any crack stops located therein may be removed from the layers altogether. In some embodiments, the layers may include epitaxial layers grown on the substrate and/or implanted layers. In other embodiments, a substrate thinning process may remove the portions of the substrate that include crack stops while leaving portions of the substrate that do not include crack stops.

It will be appreciated that methods according to embodiments of the invention may be employed to fabricate many different types of devices, including, for example semiconductor devices such as HEMTS, GaN HEMTS, LEDs, SiC MOSFETs, MESFETS, BJTs, PiN diodes, n-channel IGBTs, thyristors and vertical JFETs, GTOs and n-channel IGBTs on p-type substrates, as well as MMICs including GaN HEMTs and/or SiC devices. The foregoing list is not intended to be limiting.

In the drawings and specification, there have been disclosed typical embodiments of the invention and, although specific terms are employed, they are used in a generic and descriptive sense only and not for purposes of limitation, the scope of the invention being set forth in the following claims.

What is claimed:

1. A method of making an apparatus comprising:
   providing at least two devices on a substrate wherein the substrate has an overall thickness;
   reducing the overall thickness of the substrate; and
   thereafter providing at least one crack stop in the substrate.

2. The method of claim 1, wherein the crack stop is located separate from the at least two devices.

3. The method of claim 1, further comprising singulating the at least two devices.

4. The method of claim 1, further comprising mounting a carrier to the at least two devices on a side opposite the substrate.

5. The method of claim 1, wherein reducing the overall thickness of the substrate comprises etching, polishing, or grinding the substrate.

6. The method of claim 1, wherein providing at least one crack stop comprises dry etching or wet etching.

7. The method of claim 1, wherein providing a crack stop in the substrate is performed at the same time as providing one or more via holes through the substrate and at least one of the devices.

8. The method of claim 4, further comprising removing the carrier substrate and sawing or breaking the substrate.

9. The method of claim 6, wherein providing a crack stop in the substrate comprises dry etching or wet etching through a patterned mask.

10. The method of claim 7, further comprising forming an ohmic contact to the substrate.

11. A method of making an apparatus comprising:
    providing a device on a substrate;
    reducing an overall thickness of the substrate; and
    thereafter providing at least one crack stop in the substrate, wherein the at least one crack stop extends completely through the substrate and is aligned in a circular pattern along the perimeter of the substrate.

12. The method of claim 11, further comprising providing at least two devices on the substrate.

13. The method of claim 11, further comprising providing multiple crack stops aligned in one or more rows around the device.

14. The method of claim 11, wherein providing a crack stop in the substrate is performed at the same time as providing one or more via holes through the substrate and the device.

15. The method of claim 11, wherein the device is provided on the substrate before reducing an overall thickness of the substrate.

16. The method of claim 12, further comprising singulating the at least two devices.

17. The method of claim 14, further comprising forming an ohmic contact to the substrate.

18. A method of making an apparatus comprising:
    providing a substrate;
    providing a device on the substrate;
    reducing an overall thickness of the substrate; and thereafter providing a crack stop that is separate from the device and extends completely through the substrate.

19. The method of claim 18, wherein providing at least one crack stop comprises dry etching or wet etching.

20. The method of claim 18, wherein providing a crack stop in the substrate is performed at the same time as providing one or more via holes through the substrate and the device.

21. The method of claim 18, further comprising providing at least two devices on the substrate.

22. The method of claim 18, wherein the device is provided on the substrate before reducing an overall thickness of the substrate.

23. The method of claim 19, wherein providing a crack stop in the substrate comprises dry etching or wet etching through a patterned mask.

24. The method of claim 20, further comprising forming an ohmic contact to the substrate.

25. The method of claim 21, further comprising singulating the at least two devices.

* * * * *